(12) United States Patent
Blot et al.

(10) Patent No.: US 11,604,155 B2
(45) Date of Patent: Mar. 14, 2023

(54) METHODS, CIRCUITS AND SYSTEMS FOR OBTAINING IMPEDANCE OR DIELECTRIC MEASUREMENTS OF A MATERIAL, UNDER TEST

(71) Applicant: TransTech Systems, Inc., Latham, NY (US)

(72) Inventors: Adam D. Blot, Altamont, NY (US); Manfred Geier, Oakland, CA (US); Andrew J. Westcott, Troy, NY (US)

(73) Assignee: TRANSTECH SYSTEMS, INC., Latham, NY (US)

( * ) Notice: Subject to any disclaimer, the term of this patent is extended or adjusted under 35 U.S.C. 154(b) by 0 days.

(21) Appl. No.: 17/739,255

(22) Filed: May 9, 2022

(65) Prior Publication Data

US 2022/0260513 A1    Aug. 18, 2022

Related U.S. Application Data

(63) Continuation of application No. 17/229,958, filed on Apr. 14, 2021, now abandoned.

(60) Provisional application No. 63/010,791, filed on Apr. 16, 2020.

(51) Int. Cl.
*G01N 27/02* (2006.01)

(52) U.S. Cl.
CPC .................. *G01N 27/028* (2013.01)

(58) Field of Classification Search
CPC .................................................... G01N 27/028
See application file for complete search history.

(56) References Cited

U.S. PATENT DOCUMENTS

| | | | |
|---|---|---|---|
| 6,414,497 B1 | 7/2002 | Sovik et al. | |
| 7,219,024 B2 | 5/2007 | Gamache et al. | |
| 2011/0053646 A1* | 3/2011 | Kundmann | H01Q 21/0025 455/562.1 |
| 2014/0266268 A1* | 9/2014 | Lipowitz | G01R 27/02 324/709 |
| 2018/0172612 A1* | 6/2018 | Lipowitz | G01N 27/02 |

OTHER PUBLICATIONS

European Search Report for Application No. 21168255.4, dated Sep. 13, 2021, 9 pages.

* cited by examiner

*Primary Examiner* — Alesa Allgood
(74) *Attorney, Agent, or Firm* — Hoffman Warnick LLC

(57) ABSTRACT

Certain disclosed methods include: transmitting an excitation signal into the MUT and transmitting a reference signal to a set of magnitude and phase (M/P) detectors; receiving the response signal; separately comparing a magnitude and phase for each of the excitation signal and the reference signal with corresponding detection ranges for a first one of the M/P detectors; separately comparing a magnitude and phase for each of the response signal and the reference signal with corresponding detection ranges for a second one of the M/P detectors; iteratively adjusting the excitation signal until the response signal has both a magnitude and a phase within the corresponding detection ranges for the second M/P detector; and iteratively adjusting the reference signal until the reference signal has both a magnitude and a phase within the corresponding detection ranges for the first and the second M/P detectors.

20 Claims, 7 Drawing Sheets

KEYSIGHT IMPEDANCE ANALYZER

```
┌─────────────────────────────────────────────────────────────────────────────┐
│ P101 the at least one computing means (101) secures MUT (210) physical model parameters │
│ from System 300 and sends a control signal to the signal generating (104) means to generate transmit │
│ signals (106) over the range of frequencies for the MUT and over a range of levels or magnitudes. │
└─────────────────────────────────────────────────────────────────────────────┘
                                      │
                                      ▼
┌─────────────────────────────────────────────────────────────────────────────┐
│ P102 the transmit signal (106) is sent to the System 200 transmit electrode (201), through the MUT │
│ (210), to the receive electrode (202), and the Receive signal (121) to one of the at least two level and │
│ phase detectors (115). The detector measurement of level (magnitude) and phase is transmitted to │
│ the at least one computing means (101). │
└─────────────────────────────────────────────────────────────────────────────┘
                                      │
                                      ▼
                                                        No
                                                  P104 adjust the
                                                  level and repeat
                 ╱╲
                ╱  ╲
    P103 the at least one computing means (101) compares
    the received values of the value of the level (magnitude)
    of the receive signal (121) as measured by one of the at
    least two level and phase detectors (115) to determine if
        the reading is within the input range of the detector
                ╲  ╱
                 ╲╱
                  │ YES
                  ▼
┌─────────────────────────────────────────────────────────────────────────────┐
│ P105 the at least one computing means (101) instructs the signal generating means │
│ (104) to generate transmit signals (106) over the range of frequencies for the MUT and │
│                      over a range of phases. │
└─────────────────────────────────────────────────────────────────────────────┘
                                      │
                                      ▼
                                                         No
                                                   P107 adjust the
                                                   phase and repeat
                 ╱╲
            P106 the at least one computing means (101)
            compares the received values of the value of the phase of the
            receive signal (121) as measured by one of the at least
            two level an phase detectors (115) to determine if the
                 reading is within the input range of
                          the detector
                 ╲╱
                  │ YES
                  ▼
┌─────────────────────────────────────────────────────────────────────────────┐
│ P108 the at least one computing means (101) instructs the signal generating means (104) to generate │
│ reference signals (114) over the range of frequencies for the MUT and over a range of levels and │
│ phases. │
└─────────────────────────────────────────────────────────────────────────────┘
                                      │
                                      ▼
                                                         No
                                                   P109 adjust the level and/or
                                                   phase and repeat
              P110 the at least one computing
              means (101) compares the received values
              of the value of the level and phase of the reference signal (114) as
              measured by one of the at least two level and phase detectors
                  (115) to determine if the reading is within the
                           input range of the detector
                                      │ YES
                                      ▼
                                  ┌────────┐
                                  │  P111  │
                                  │  END   │
                                  └────────┘
```

FIGURE 7

METHODS, CIRCUITS AND SYSTEMS FOR OBTAINING IMPEDANCE OR DIELECTRIC MEASUREMENTS OF A MATERIAL, UNDER TEST

PRIORITY CLAIM

This application claims priority to U.S. patent application Ser. No. 17/229,958, filed on Apr. 14, 2021, which itself claims priority to U.S. Provisional Patent Application No. 63/010,791, filed on Apr. 16, 2020, the entire contents of each of which is herein incorporated by reference.

TECHNICAL FIELD

The disclosure relates generally to circuits, systems, and methods for determining characteristics of a material under test (MUT) by generating and measuring electric signals at a specific frequency or over a range of frequencies to measure the dielectric properties of that MUT. The dielectric characteristics can then be correlated to a physical property or properties of the MUT such as density or moisture.

BACKGROUND

The use of electrical impedance measurements to quantify physical characteristics of construction, manufacturing, and biological materials is the basis of an increasing number of techniques, including impedance tomography and impedance spectroscopy. An important factor in successfully characterizing an MUT is the ability to obtain accurate and repeatable measurements of electromagnetic properties of an MUT (e.g., the electrical impedance, admittance, capacitance, permittivity, etc.) of that MUT. These measured values are subsequently converted to information about the dielectric properties of the MUT. However, conventional approaches for obtaining electrical data for characterizing MUTs can be both inaccurate and insufficiently repeatable.

SUMMARY

All examples and features mentioned below can be combined in any technically possible way.

The present application presents an electronic circuit and measurement system for generating electric excitation signals at a specific frequency or over a range of frequencies that enable accurate measurements of response signals after excitation of the MUT. The transmitted and response signals can be used to compute the impedance and dielectric properties of the MUT.

Particular approaches involve generating and measuring electric signals at a specific frequency or over a range of frequencies to measure the impedance or the dielectric signature of that MUT. The measurement of electrical impedance to quantify physical properties of construction, manufacturing, or biological materials is the basis of a variety of measurement techniques including impedance tomography and impedance spectroscopy. One requirement to successful characterization of an MUT is the accurate and repeatable measurements of the electrical impedance (or admittance) signature, which subsequently is converted to information about the dielectric properties of the MUT, which in turn can be correlated with physical (non-electrical) properties of the MUT. Other electromagnetic characteristics can be used to successfully characterize an MUT in various implementations. Various particular implementations include an electronic circuit, measurement system, and method for generating electric excitation signals at a specific frequency or over a range of frequencies that provide accurate measurements of the electric signals in response to this excitation of the MUT for computation of the impedance and dielectric signal properties of the MUT.

The subject matter of U.S. Pat. Nos. 5,900,736, 6,414,497, 6,803,771, 7,219,024, 9,465,061, and 9,805,146; as well as: US Patent Publication No. 2009/0270756, US Patent Publication No. 2012/0130212; US Patent Publication No. 2013/0307564, US Patent Publication No. 2014/0266268, US Patent Publication No. 2014/0278300, US Patent Publication No. 2015/0137831, US Patent Publication No. 2015/0212026, US Patent Publication No. 2018/0128934, US Patent Publication No. 2018/0172612; Provisional U.S. Patent Application No. 62/161,9275 (filed on Jan. 25, 2018); and Provisional U.S. Patent Application No. 62/661,682 (filed on Apr. 24, 2018) describe impedance-related techniques for determining characteristics of materials, and are each incorporated by reference herein in its entirety.

The methods, electronic circuits and systems of the present subject matter relate to the measurement of the impedance as it varies with the dielectric properties of the MUT, as well as electronic devices and/or components for performing such measurements at a specific frequency or over a range of frequencies, with provisions for the characterization of the excitation (also referred to as "transmit"), the response (also referred to as "received"), and reference signals to produce a measured signal within a desired range of the electronic measuring components over the frequency range, based upon the magnitude or strength and phase shift of the measured signal for the specific frequency or range of frequencies.

In some cases, a method of characterizing a response signal for detecting physical characteristics of a material under test (MUT) includes: transmitting an excitation signal into the MUT using a transmitting electrode on a sensor array and transmitting a reference signal to a set of magnitude and phase (M/P) detectors; receiving a response signal from the MUT via a receiving electrode on the sensor array based on the excitation signal; separately comparing a magnitude and phase for each of the excitation signal and the reference signal with corresponding detection ranges for a first one of the M/P detectors; separately comparing a magnitude and phase for each of the response signal and the reference signal with corresponding detection ranges for a second one of the M/P detectors; and iteratively adjusting the excitation signal until the response signal has both a magnitude and a phase within the corresponding detection ranges for the second M/P detector; and iteratively adjusting the reference signal until the reference signal has both a magnitude and a phase within the corresponding detection ranges for the first and the second M/P detectors.

In additional cases, a system is configured to characterize a response signal for detecting physical characteristics of a material under test (MUT). In these cases, the system can include: a sensor array for communicating with the MUT; a set of magnitude and phase (M/P) detectors; a signal generator coupled with the set of M/P detectors and the sensor array; and a computing device configured to control processes including: initiating: a) transmission of an excitation signal into the MUT with a transmitting electrode on the sensor array and b) transmission of a reference signal to the set of magnitude and phase (M/P) detectors; receiving a response signal from the MUT via a receiving electrode on the sensor array based on the excitation signal; separately comparing a magnitude and phase for each of the excitation signal and the reference signal with corresponding detection ranges for a first one of the M/P detectors; separately comparing a magnitude and phase for each of the response signal and the reference signal with corresponding detection ranges for a second one of the M/P detectors; iteratively adjusting the excitation signal until the response signal has both a magnitude and a phase within the corresponding detection ranges for the second M/P detector; and iteratively adjusting the reference signal until the reference signal has both a magnitude and a phase within the corresponding detection ranges for the first and the second M/P detectors.

Particular aspects of the present subject matter provide electronic circuits, systems, and methods to apply an electronic circuit which: 1) generates an excitation signal and a reference signal at a specific frequency or over a range of frequencies; 2) applies the excitation a signal to a material under test (MUT) (which may include one or more subcomponents); 3) characterizes the response signal with respect to the reference signal; 4) determines the magnitude and phase relationship between the response signal produced in presence of the MUT relative to the reference signal; 5) computes the impedance and dielectric properties of the MUT (and in some cases, subcomponents); and 6) applies the measured dielectric properties to a physical model to correlate the measurement to a physical property or properties of the MUT (or a sample of the MUT that has been subjected to engineering testing to determine desired information about physical properties). The approaches described herein can include characterization methods for the measuring circuit board and sensor system, as well as a method to collect information in the form of electrical quantities with the circuit board and a sensor system.

Various embodiments of the disclosure relate generally to an electronic circuit and system for the measurement of the impedance to electric current through sensing system in communication with a material under test (MUT) and subsequent extraction of the dielectric properties of the MUT. In some cases, the system includes a circuit having magnitude and phase detectors to measure the change in magnitude or strength and phase difference between a reference signal and an excitation (or transmit) signal and between the reference signal and the response (or received) signal produced by the transit of the excitation signal through the MUT. The system can include at least one computing device configured to control the generation of the excitation and reference signals, to evaluate the measured signal levels, and to adjust excitation and/or reference signals to produce input signals to the magnitude and phase detectors and other circuit components that result in best performance of these detectors and components. Circuits according to various embodiments can include a signal strength determiner and/or phase determiner for determining the phase shift between the excitation signal, the reference signal, and the response signal specific to the MUT. The strength and phase determiner may be combined in a single circuit component. According to various embodiments, the measured difference in signal strength and phase are used to compute the (complex) electrical impedance and dielectric properties of the MUT. This (MUT/system-specific) impedance or the (MUT-specific) dielectric property can be correlated with a physical property or properties of the MUT. The system may be operated at a single frequency, or over a range of frequencies.

In some particular embodiments, a system can include: a signal generator which generates the excitation signal and the reference signal; an excitation electrode connected with the signal generator and in electrically conductive or non-conductive contact with a material under test (MUT); a receiving electrode in electrically conductive or non-conductive contact with the material under test (MUT) which is part of the return path of the excitation current flowing from the excitation electrode through the MUT to the receiving electrode as the response signal; a reference signal which is compared to the excitation signal and the response signal at the receive electrode by a magnitude detector and/or phase detector; and at least one computing device connected with the signal generator, the signal strength determiner(s) and/or phase determiner(s) for the excitation and reference signals and for the response and reference signals, the at least one computing device configured to: send a control signal to the signal generator to initiate and conduct an excitation signal to the MUT via the excitation electrode and to the excitation-to-reference strength and phase determiner at a selected frequency or over a range of frequencies.

Implementations may include one of the following features, or any combination thereof.

In some particular embodiments, the at least one computing device receives digitized strength and phase data from analog to digital converters connected to the output of the strength and/or phase determiner(s) and communicates the data to another computing device to be used to compute the measured impedance or dielectric property, and to correlate impedance or dielectric property with a physical model of the MUT to quantify a physical property or properties of the MUT.

In particular aspects, the computing device is further configured to: compute an electromagnetic property of the MUT based on the measured magnitude and phase for the response signal and the reference signal; and correlate the electromagnetic property with a physical property of the MUT based on a physical model of the MUT or a laboratory (or engineering) test of the MUT, wherein the electromagnetic property comprises one or more of: impedance, susceptance, permittivity or admittance.

In some particular embodiments, the at least one computing device provides the computation of the measured impedance or the dielectric property to be correlated with a physical model of the MUT to quantify a physical property or properties of the MUT.

In some particular embodiments, the at least one computing device provides the controlling function for the signal generator(s), switch(es), and other controllable elements of the circuit.

In particular aspects, the first M/P detector provide a reading of the magnitude and phase of the excitation signal and the reference signal, and the second M/P detector provides a reading of the magnitude and phase of the reference signal and the response signal.

In certain cases, the readings are obtained by a computing device configured to control the iterative adjustment (via the signal generator) of the amplitude and phase of the excitation signal and the reference signal.

In some implementations, the reading for each of the excitation signal, the reference signal and the response signal comprises separate magnitude and phase components.

In particular cases, the iteratively adjusting includes adjusting an amplification of the excitation signal and/or the reference signal.

In some aspects, a method further includes, after verifying that the excitation signal produces a response signal with a magnitude and phase within the corresponding detection ranges of the second M/P detector and a reference signal with a magnitude and phase within the corresponding detection ranges for both the first and the second M/P detectors:

analyzing data obtained by the first and second M/P detectors using a data model about physical characteristics of the MUT to detect at least one physical characteristic of the MUT.

In certain aspects, the analyzing includes correlating impedance or dielectric values for the MUT with an impedance value-to-physical characteristic correspondence table or a dielectric value-to-physical characteristic correspondence table. In some implementations, the correspondence table(s) are developed using a physical model of the MUT or by physical sampling or engineering evaluations of the MUT.

In particular implementations, a method further includes converting the reference signal, the excitation signal and the response signal from analog format to digital format prior to separately comparing the reference signal, the excitation signal and the response signal with the corresponding detection ranges for the first and second M/P detectors.

In some cases, the transmitting electrode includes a single transmitting electrode.

In certain aspects, the receiving electrode includes a single receiving electrode that surrounds the transmitting electrode.

In particular implementations, the receiving electrode includes a plurality of receiving electrodes, and the method further includes switching between the plurality of receiving electrodes for the response signal using an electrode switch.

In some aspects, the excitation signal and the reference signal are both generated by a signal generator with a common control signal, and the excitation signal and the reference signal have a common frequency and a distinct magnitude and/or phase.

Particular aspects of the present subject matter provide a system to generate electric signals at a specific frequency or over a range of frequencies and with varying levels of strength or magnitude to secure impedance or dielectric measurements on a Material Under Test (MUT) which then can be correlated with physical properties of the MUT. The system may include: at least one computing means which can receive parameters for a physical model of the MUT (and/or physical/engineering testing data about the MUT) and digitize data for the computation of the impedance or dielectric properties of the MUT; transmit control signals to the at least one signal generator and circuit components; and transmit data to a user interface; the at least one signal generator which generates two electric signals at a specific frequency or over a range of frequencies and at various amplitudes and phases of which: an excitation signal which is transmitted to an electrode in electrically conducting or non-conducting communication with the MUT and to the first of the at least two magnitude and phase detectors; and a reference signal which is transmitted to one of the at least two of the first magnitude and phase detector and the second of the at least two magnitude and phase detectors. The excitation signal which is transmitted to an electrode in communication with the MUT, produces a current through the MUT which is collected at least one receiving electrode which is in electrically conducting or non-conducting communication with the MUT and where the current is converted to a voltage (referred to as the received) signal that is transmitted to the second of the at least two magnitude and phase detectors. The magnitude and phase of the excitation signal relative to the reference signal from one of the at least two magnitude and phase detectors is transmitted as digital data to the at least one computing means. The magnitude and phase of the received signal relative to the reference signal from another of the at least two magnitude and phase detectors is transmitted as digital data to the at least one computing means. The at least one computing means processes the digitized magnitude and phase data. The at least one computing means transmits the processed data to a user interface which communicates the desired physical properties of the MUT. The material under test may be a soil.

Optionally, the material under test may be any material under test that produces a complex impedance spectrum when excited with methods of Electrical Impedance Spectroscopy (EIS). The specific frequency or range of frequencies applied may, in particular, fall within the range of 10 kHz to 100 MHz, and in some cases, 100 KHz to 100 MHz. In additional cases, a method comprises: at least one signal generator generating an electric excitation signal under control of an at least one computing means at a specific frequency or over a range of frequencies at specific amplitude within a range of amplitudes and a fixed phase whose voltage signal is transmitted to an electrode in communication with a material under (MUT) and produces an electric current through the MUT to a receiving electrode which is in electrically conducting or non-conducting communication with the MUT. The current collected at the receiving electrode is converted to a voltage signal (received signal) which is transmitted to one of the at least two magnitude and phase detectors where the at least one computing means determines if the amplitude of the received signal falls within the design amplitude input range of the magnitude and phase detector. If the amplitude of the received signal is not within the desired range for the magnitude and phase detector and the magnitude of the received signal relative to the reference signal is not within the desired tolerance band of the target magnitude, the computing means adjusts the amplitude of the excitation signal until the measured level is within the desired range and tolerance band. If the amplitude of the received signal is within the desired input amplitude range for the magnitude and phase detector and the magnitude of the received signal relative to the reference signal is within the tolerance band around the target magnitude, the excitation amplitude is fixed and the at least one computing means then instructs the at least one signal generator to generate electric signals at a fixed frequency or over a range of frequencies at a specific phase within a range of phases and at the fixed amplitudes. The electric signal with varying values of phase is transmitted to an electrode in electrically conductive or non-conductive communication with the MUT and produces a current through the MUT which is collected at a receiving electrode which is in electrically conductive or non-conductive communication with the MUT. The current collected at the receiving electrode is converted to a voltage signal (received signal) which is transmitted to one of the at least two magnitude and phase detectors where the at least one computing means determines if the phase of the received signal falls within the design input phase range of the amplitude and phase detector. If the phase of the received signal is not within the desired range for the magnitude and phase detector is not within the desired tolerance band around the desired target phase output, the computing means adjusts the phase of the excitation signal until the phase of the received signal is within the desired range and within the desired tolerance band. If the phase of the received signal is within the desired phase input range for the level and phase detector and within the desired tolerance band, the amplitude and phase are fixed and used for the values of the electric excitation signal which is measured by the other of the at least two magnitude and phase detectors. The at least one computing means then directs the at least one signal generator to generate a reference signal whose amplitude and phase fall within the design ranges of the one of the at least two magnitude and phase detectors used to measure the received signal and is adjusted to produce the magnitude and phase outputs within the desired tolerance band about the target magnitude and phase of the one of the at least two magnitude and phase detectors used to measure the received signal. The at least one computing means receives and processes the digitized magnitude and phase measurement from the at least two magnitude and phase detectors for the excitation signal and the received signal. The at least one computing means transmits the processed data to a user interface which communicates the desired physical properties of the MUT.

Various approaches can be used to determine electromagnetic properties of the MUT, including, e.g., one or more of: impedance, susceptance, permittivity or admittance.

Two or more features described in this disclosure, including those described in this summary section, may be combined to form implementations not specifically described herein. The system and in particular its computing device may be configured to carry out the methods described herein. Further variants of the described methods result from the intended use of the described system and its components.

The details of one or more implementations are set forth in the accompanying drawings and the description below. Other features, objects and advantages will be apparent from the description and drawings, and from the claims.

BRIEF DESCRIPTION OF THE FIGURES

FIG. 7 is a flow diagram illustrating processes according to various additional implementations.

Figure 1:
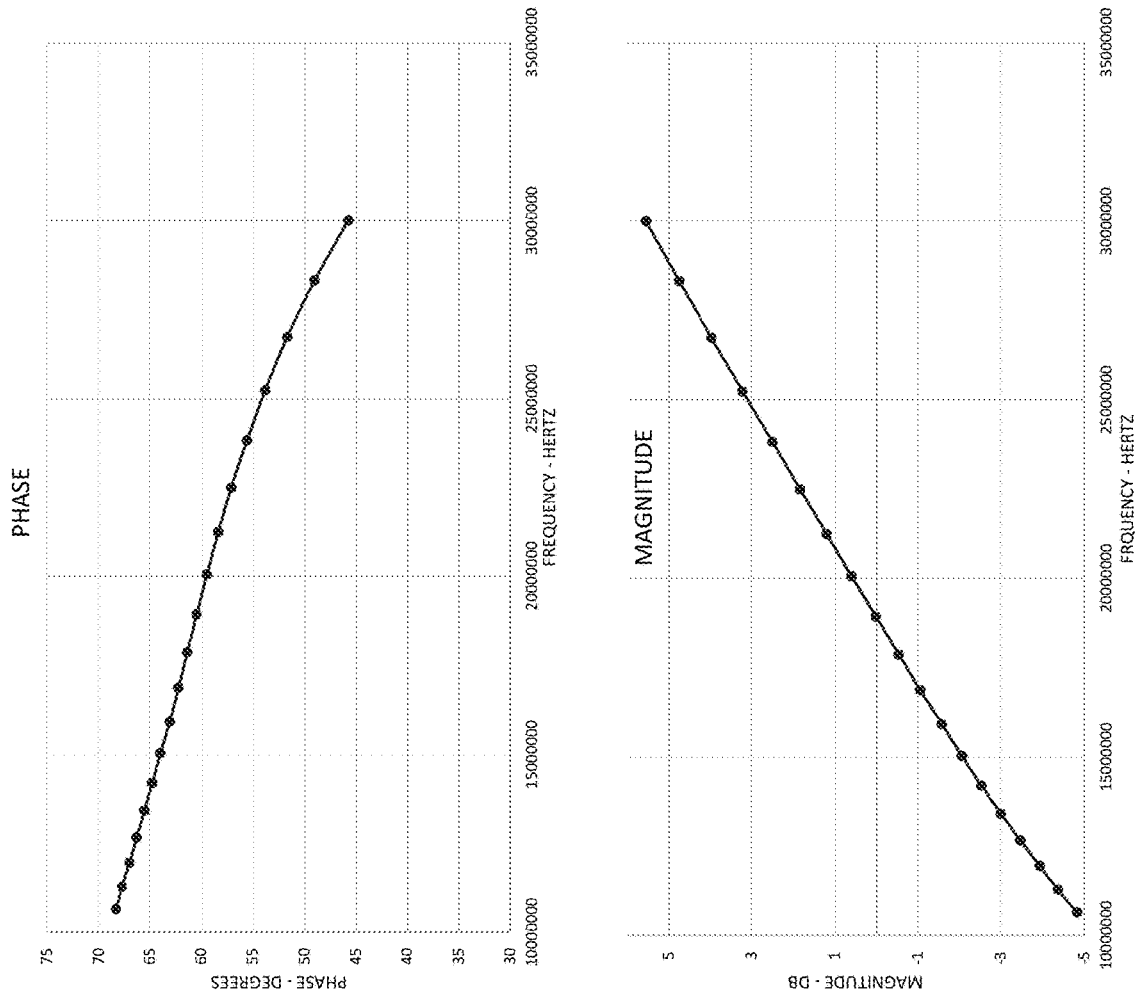
FIG. 1. shows an illustration of a phase and magnitude spectrum over the range of frequencies of interest for a typical soil tested with a typical embodiment of an impedance measurement system.

It is noted that the drawings of the various implementations are not necessarily to scale. The drawings are intended to depict only typical aspects of the disclosure, and therefore should not be considered as limiting the scope of the implementations. In the drawings, like numbering represents like elements between the drawings.

DETAILED DESCRIPTION

The various circuits, systems, methods, and procedures described herein are related to the generation of electric signals at a single frequency or over a range of frequencies for measuring the impedance or dielectric properties of a material under test (MUT). The frequency or range of frequencies is selected on the basis of the properties of the MUT for an impedance-spectroscopic analysis for the determination of physical properties of the MUT. In certain implementations, a single frequency is adequate for tomographic analysis, e.g., as described in US Patent Publication Nos. 2016/0161624, and 2018/0128934, and U.S. Pat. Nos. 9,465,061, 9,804,112, and 10,324,052; or for the determination of physical properties of selected materials that act as pure capacitors, such as hot mix asphalt, as described in U.S. Pat. Nos. 5,900,736, 6,414,497, and 6,803,771. However, for a more complex MUT such as a soil, an impedance-spectroscopic analysis over a range of frequencies is required, e.g., as described in U.S. Pat. Nos. 7,219,024, 9,465,061, 9,805,146, and 10,161,893. Each of the afore-mentioned applications, publications and issued patents is hereby incorporated by reference in its entirety.

While certain example implementations are described with reference to determining electromagnetic properties of an MUT such as impedance, various approaches can be used to determine additional, or alternative, electromagnetic properties of the MUT, including, e.g., one or more of: susceptance, permittivity or admittance.

Commonly labeled components in the FIGURES are considered to be substantially equivalent components for the purposes of illustration, and redundant discussion of those components is omitted for clarity.

While one example MUT described in this disclosure is a soil, the various circuits, systems, methods and procedures described herein are applicable to any material under test that has a complex impedance spectrum, e.g., where Electrical Impedance Spectroscopy (EIS) may be applied. For example, U.S. Pat. No. 9,465,061 describes a method of conducting an in-process inspection of solid materials with EIS. In certain cases, there is a need to conduct in-process inspections and characterizations of fluids, as suggested by U.S. Pat. Nos. 9,372,183, 9,389,175, and 9,797,855. U.S. Pat. No. 9,389,175 applies an optical detection system, and U.S. Pat. Nos. 9,372,183 and 9,797,855 apply impedance flow cytometry, which counts and characterizes cells. Each of the afore-mentioned US patents is incorporated by reference in its entirety. Additional publications discuss various electromagnetic methods of characterizing dairy products (e.g., milk) and other foods such as olive oil, fruits, vegetable oils, cookies, pork, and fish. In all these examples, the complex impedance spectrum extends over a broad range of frequencies. This is shown in FIG. 1, illustrating corresponding Phase and Magnitude graphs over a frequency range for a typical soil tested with a conventional impedance soil measurement system. This broad range of frequencies makes it difficult to secure accurate measurements that can be used to correlate the measured impedance spectrum with a physical property or properties of the MUT, for example, density (or compaction level) and/or moisture level for a soil.

Figure 2:
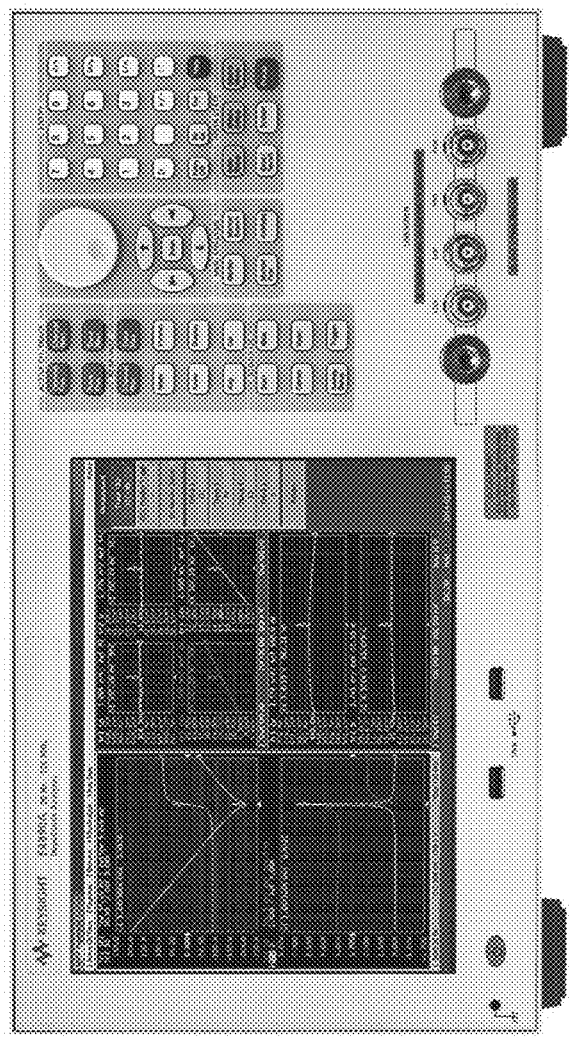
FIG. 2 Shows and illustration of the Keysight E4990A Impedance Analyzer.

A typical range of frequencies of interest for soils is from about 10 kHz to approximately 100 MHz, and in particular cases, from about 100 kHz to about 100 MHz. These ranges of frequencies have been shown to provide an impedance spectrum that can be used to correlate with physical properties such as density (compaction level) and moisture level of the soil. As can be seen in FIG. 1, the values of the phase (e.g., about 45 degrees up to about 70 degrees) and magnitude (e.g., about −5 DB to about 5 DB) over the range of frequencies is very large. These values are used to compute the complex impedance of the MUT over the frequency range of interest. In order to secure accurate data over the entire range of frequencies, a very sophisticated (and expensive) instrument is typically required. One such instrument is the Keysight Technologies E4990A Impedance Analyzer, an image of which is shown in FIG. 2. This Impedance Analyzer is a 30-pound (14 kg) instrument that is about 17.0-in wide, 9.3-in high and 11.7-in deep (432 mm×239 mm×296 mm) and requires laboratory environmental conditions to function effectively. As such, the conventional systems and approaches are unwieldy in practical, field use scenarios. To address these shortcomings in conventional systems and approaches, various disclosed implementations provide circuits, systems, and methods for use in the field and/or production environment that are able to secure comparable levels of data accuracy from an MUT over the desired frequency range. Other approaches to satisfying this objective are presented in US Patent Publication No. 2014/0266268 and U.S. Pat. No. 10,330,616 (each incorporated by reference in its entirety).

While certain frequency ranges of interest are described herein, other ranges and sub-ranges may also be of interest. For example, the systems and approaches described herein can be applicable to investigating soils in frequencies around 32 kHz, e.g., 32 kHz+/−10 kHz, 15 kHz or 20 kHz.

Various commercially available electronic components are described as examples relating to the various embodiments of the disclosure. These are used only for illustrative purposes. Other such components may be used as selected by one skilled in the art.

Figure 3:
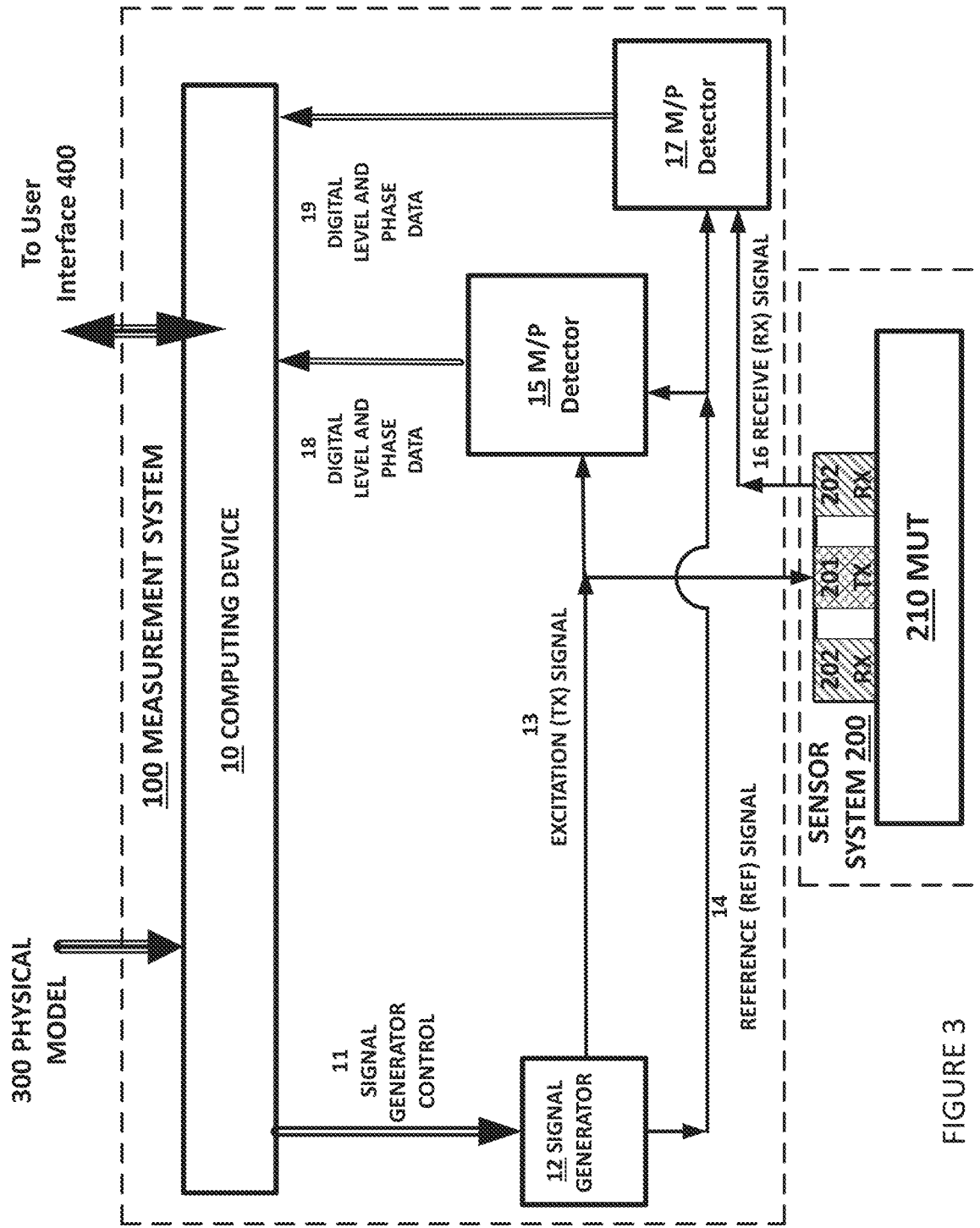
FIG. 3 shows a general configuration of a sensor system including an impedance measurement circuit according to various embodiments of the disclosure.

Referring to FIG. 3, a schematic depiction of a measurement system (or simply, system) 100 is shown according to various implementations. In some cases, the measurement system 100 interacts with (or includes) a plurality of elements (or, sub-systems). In various implementations, system 100 includes a circuit to generate electric signals at a specific frequency (or over a range of frequencies), along with controls (e.g., control software such as program code) to communicate with the other elements of an overall measurement system. As shown in FIGURE (FIG. 3, the measurement system 100 is configured to interact with a sensor system 200, which in turn communicates with a MUT 210. System 100 is configured to receive a physical model 300, which in some example cases is the physical model of the MUT 210, e.g., soil. That is, the physical model 300 can include a physical soil model where the MUT 210 includes soil. Additionally, the sensor system 200 can communicate with an interface (e.g., user interface) 400, which can be local or remote relative to the system 100. In some cases, the interface 400 enables a user or other operator to communicate desired physical attributes for testing of the MUT, e.g., for soil this could include density and/or moisture.

In various implementations, the sensor system 200 includes a central excitation electrode (TX 201) surrounded by a concentric coplanar ring including a receiving electrode (RX 202). In some cases, the design of the sensor is described in U.S. Pat. Nos. 5,900,736 and 7,219,024. In some cases, the electrodes 201, 202 are in direct physical contact with the MUT 210 (e.g., as described with respect to the sensor system in U.S. Pat. No. 5,900,736). In other cases, the electrodes 201, 202 are offset (separated) from the MUT 210 (e.g., such that a gap or standoff is present between the electrodes 201, 202 and the MUT 210, as is described with respect to the sensor system in in U.S. Pat. No. 7,219,024). The sensor system 200 and MUT 210 present a resistive and/or capacitive load on the circuit of the measurement system 100. The system 100 is configured to account for and accommodate for the load characteristics in the sensor system 200 and MUT 210 in order to secure accurate readings of the change in the magnitude and phase of the response signal (received at RX 202) compared to the excitation signal (sent via TX 201).

The physical model of the MUT (e.g., soil) 300 is used in setting the parameters of the circuit in system 100. U.S. Provisional Patent Application No. 62/661,682 describes a system and method for securing a physical model of soils for use with system 100.

Certain implementations may replace the physical model and/or supplement the physical model of the MUT 300 with testing data about physical characteristics of the MUT 300, e.g., an ASTM test determining physical characteristics of the MUT 300.

Interface 400 can include any conventional interface, e.g., a user interface, to enable a user such as a human user or other communication system to communicate physical properties of the MUT 210 from the measurement system 100, along with enabling data logging such as data about time and/or location of the measurement. Example interfaces can include a laptop computer, a tablet, a smart phone, or a dedicated user interface that is connected (e.g., physically and/or wirelessly) with the measurement system 100. In any case, the interface 400 is configured to communicate data from the measurement system 100 in real time, e.g., in a field-testing environment.

As shown in FIG. 3, in various implementations, system 100 can include at least one computing device (e.g., processor and/or memory) 10 that is configured to receive data from external systems, e.g., to receive the physical (MUT) model 300, as well as send and receive data to/from the interface system 400. In some cases, the physical (MUT) model 300 includes information about a desired frequency range and expected values of the impedance spectrum for a response from the MUT 210. In certain aspects, information about the desired frequency range needed and the possible range of measured magnitudes and phases of the impedance spectrum are obtained from prior field testing or laboratory testing with a system as described in U.S. Provisional Patent Application No. 62/661,682. The computing device 10 sends a control signal 11 to a signal generator 12 and receives digital data 18, 19 about on the magnitude (level) and phase of the generated signal from respective magnitude and phase (M/P) detectors (e.g., TX and RX) 15 and 17. The (TX) M/P detector 15 compares the excitation TX signal 13 with a reference signal 14, both generated by the signal generator 12. The (RX) M/P detector 17 compares the reference signal 14 with the receive (response) RX signal 16 (received at electrode RX 202). The excitation voltage signal 13 causes current flow from the TX electrode 201 on the sensor, through the MUT 210, to the receiving electrode RX 202, where it is measured as the voltage (response) signal 16 at the RX level and phase detector 17. The (digital) output signals from the magnitude and phase (M/P) detectors 15 and 17 are transmitted to the computing device 10. The computing device 10 includes a processor for processing the magnitude and phase data, and a communication system (e.g., conventional wireless and/or wireless communication system) for sending the results as an output, e.g., at interface 400.

Figure 4:
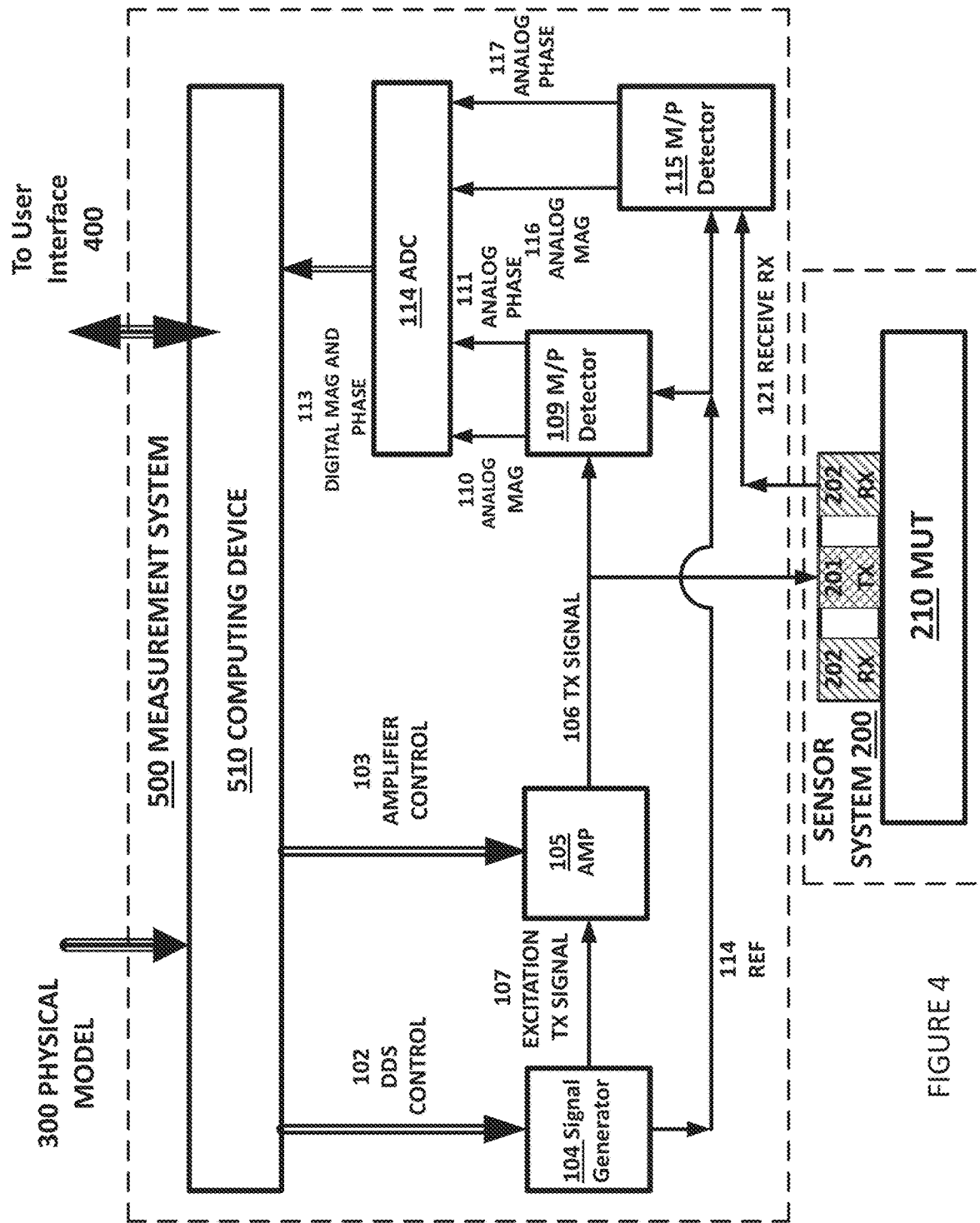
FIG. 4 shows an alternate configuration of a sensor system including an impedance measurement circuit with selected circuit elements according to various embodiments of the disclosure FIG. 5. shows an alternate configuration of a sensor system including an impedance measurement circuit with selected circuit elements according to various embodiments of the disclosure and an alternate sensor configuration.

FIG. 4 is a schematic depiction of a system 500 according to various additional implementations. Commonly labeled features within the FIGURES can represent the same or similar components, separate descriptions of which may be omitted. In some cases, the system 500 includes at least one computing device 510, which can include at least one processor and/or a memory. In certain implementations, the computing device 510 includes a digital signal controller, e.g., similar to a dsPIC33F 16-bit Digital Signal Controller. However, other microprocessors may be used in additional implementations. In particular implementations, system 500 further includes a signal generator 104, such as a dual channel Direct Digital Synthesis (DDS) chip. The signal generator 104 is connected to the computing device 510 and is configured to receive control instructions as described herein. In particular examples, the signal generator 104 includes a device such as an Analog Devices AD9958. In some cases, multiple single-channel signal generator chips may be used in place of, or in addition to a dual-channel ship. The signal generator 104 is configured to generate two signals at the same frequency at different levels (magnitudes, or strengths): an excitation (TX) signal 107, and a reference signal 114. In various implementations, the amplitudes (or, magnitudes) of the signals, as well as the phases, are separately set at different values for the excitation signal 107 and the reference signal 114. In certain implementations, system 500 includes an amplifier 105 for amplifying the excitation signal 107 and transmitting an amplified (TX) signal 106 to the transmit electrode 201 of the sensor system 200 and to a (TX) magnitude and phase (M/P) detector 109. An example amplifier 105 can include an AD4870 (from Analog Devices) or a similar device. In certain implementations, the computing device 501 sends an amplifier control signal 103 to control the amplifier 105, e.g., in amplifying excitation signal 107. In the example embodiment of system 500 shown in FIG. 4, an additional magnitude and phase (M/P) detector 115 is shown for detecting the response signal 121 from the response (receiving) electrode 202. In some cases, the M/P detector 115 is a similar model/make as M/P detector 109, however, in other cases, these M/P detectors are distinct types. In some cases, the M/P detector 115 is an AD8302 or similar device. In practice, the computing device 510 instructs the signal generator 104 to generate the reference signal 114 and the excitation (TX) signal 107. The reference signal 114 is transmitted to the (TX) M/P detector 109 and also to the response M/P signal detector (RX) 115. The excitation voltage signal 107, once amplified and transmitted as TX signal 106, produces current flow from the TX electrode 201 on the sensor system 200, through the MUT 210, to the receiving electrode RX 202. The response signal 121 (in response to the excitation) is measured at the response M/P detector (RX) 115. In certain cases, the two M/P detectors 109, 115 (e.g., including an AD8302) produce analog output signals proportional to the logarithmic amplitude ratio (also referred to as magnitude) of and the phase difference between, respectively, the (TX) excitation signal 106 and the reference signal 114 (in M/P detector 109), and the (RX) receive signal 121 and the reference signal 114 (in M/P detector 115). In various implementations, these two magnitude and phase analog signals 110, 111, 116, 117, one set for each of magnitude and phase detectors (TX 109 and RX 115), are converted to digital signals by an analog to digital converter (ADC) 114 prior to being transmitted back to the computing device 510 (e.g., for storage, processing, output to a user interface 400, etc.). In this example embodiment of system 500, the analog to digital converter (ADC) 114 can include Maxim MAX 1239 analog-to digital converter or similar device, that accepts the two sets of analog magnitude and phase signals and converts them to digital signals for transmission to the computing device 510.

As noted herein, the amplitude of the excitation signal 107 generated with the signal generator 104 may be amplified by the amplifier 105. In some cases, after passing through the amplifier 105, the TX (voltage) signal 106 is measured with the M/P detector 109 and also applied to the TX (excitation) electrode 201 on the sensor system 200. This TX signal 106 causes a current flow through the MUT 210, which is detected at the receive electrode (RX) 202, where it is transmitted as the measurable voltage (RX) signal 121 to (RX) M/P detector 115. The amplitude of the receive (RX) signal 121 is dictated by the amplitude of the (TX) signal 106 and the dielectric properties of the MUT 210. By changing the amplitude of the TX signal 106 in either the signal generator 104 or the amplifier 105 (e.g., via instructions from computing device 510), the amplitude of the receive (RX) signal 121 measured by the M/P detector 115 is changed. In various implementations, the computing device 510 is configured (e.g., programmed) to adjust the amplitude of the output (TX) signal 106 (e.g., via adjustment to the DDS control signal 102 and/or the amplifier control signal 103) until the receive (RX) signal 121 detected at the M/P detector 115 falls within one or more predefined ranges (e.g., an input range for the M/P detector 115, as well as a distinct, but overlapping input range for the M/P detector 109). In some cases, adjusting the receive (RX) signal 121 to fall within one or more range(s) of the (RX) M/P detector 115 may necessitate a (TX) signal 106 that would fall outside the range of the (TX) M/P detector 109. In these cases, additional measures of proportionate attenuation of the stronger (TX) signal 106 would be required, e.g., by an attenuator before M/P detector 109 (not shown). In various implementations, the phase of the excitation (TX) signal 107 from the signal generator 104 is independently adjusted by the DDS Control signal 102, in order to adjust the phase of the receive (RX) signal 121. In other implementations, e.g., where the M/P detector 115 has a broad acceptable phase range (e.g., such as where the M/P detector 115 includes an AD8302 chip), the computing device 510 need not independently adjust the phase of the excitation (TX) signal 107. In particular cases, the amplitude and phase of the reference signal 114 is specifically defined for TX and RX measurements within the input range specified for the M/P detectors (e.g., Analog Devices input specifications for the AD8302 chip).

In various implementations, the ability to independently set the amplitude of the excitation and reference signals to enhance performance and compatibility of measured signals with the signal input range of the magnitude and phase detectors significantly improves the accuracy of data about the MUT 210, as compared with conventional approaches. In the illustration of system 500 (FIG. 4), the function of magnitude and phase detection is performed by M/P detectors 109, 115 (e.g., Analog Devices AD8302 or other comparable magnitude and phase detectors). Having two comparisons against the reference signal (excitation (TX) 106 vs. reference 114 and receive (RX) 121 vs. reference 114) enables the computing device 510 to compute the complex ratio of excitation (TX) voltage signals and response (RX) voltage signals, expressed in terms of magnitude (e.g., logarithmic amplitude ratio) and phase difference as:

$$M_{TX\text{-}REF} - M_{RX\text{-}REF} = M_{TX\text{-}RX}$$

$$P_{TX\text{-}REF} - P_{RX\text{-}REF} = P_{TX\text{-}RX}$$

where $M_{TX\text{-}REF}$ is the magnitude of the TX signal 107 relative to the reference signal 114;

where $M_{RRX\text{-}REF}$ is the magnitude of the RX signal 121 relative to the reference signal 114;

where $M_{TX\text{-}RX}$ is the magnitude of the TX signal 107 relative to the RX signal 121;

where $P_{TX\text{-}REF}$ is the phase of the TX signal 107 relative to the reference signal 114;

where $P_{RRX\text{-}REF}$ is the phase of the RX signal 121 relative to the reference signal 114; and where $P_{TX\text{-}RX}$ is the phase of the TX signal 107 relative to the RX signal 121.

After calculating the magnitude and phase differences between the excitation 107 and response 121 signals, the computing device 510 is configured to compare those magnitude and phase differences with the physical model of the MUT (e.g., soil) 300 to determine physical properties of the MUT. As noted herein the physical model of the MUT 300 can include magnitude and phase correspondence information (e.g., tables, correlations, etc.) with physical properties of an MUT. For example, for particular MUT types (e.g., soil), the physical model 300 includes magnitude and/or phase ranges for signal responses that correspond with particular physical properties or characteristics of the MUT. In particular examples, density or moisture content values or ranges are correlated with distinct magnitude and/or phase values or ranges, such as those calculated by the computing device 510 using the approaches described herein.

The measured magnitudes $M_{TX\text{-}REF}$ and $M_{RX\text{-}REF}$ and phases $P_{TX\text{-}REF}$ and $P_{RX\text{-}REF}$ can also be used to characterize the measurement systems described herein (e.g., measurement system 100 in FIG. 3, measurement system 500 in FIG. 4, and measurement system 600 in FIG. 5) when replacing an unknown MUT with an object of known electrical properties. For example, in combination with information regarding components of the measurement systems (from additional independent measurements and/or component specifications), the measurement of materials of known electrical properties, such as polyethylene, glass, G9 composite, and graphite, enables calibration and establishment of a model for conversion of impedance data to dielectric properties.

Figure 5:
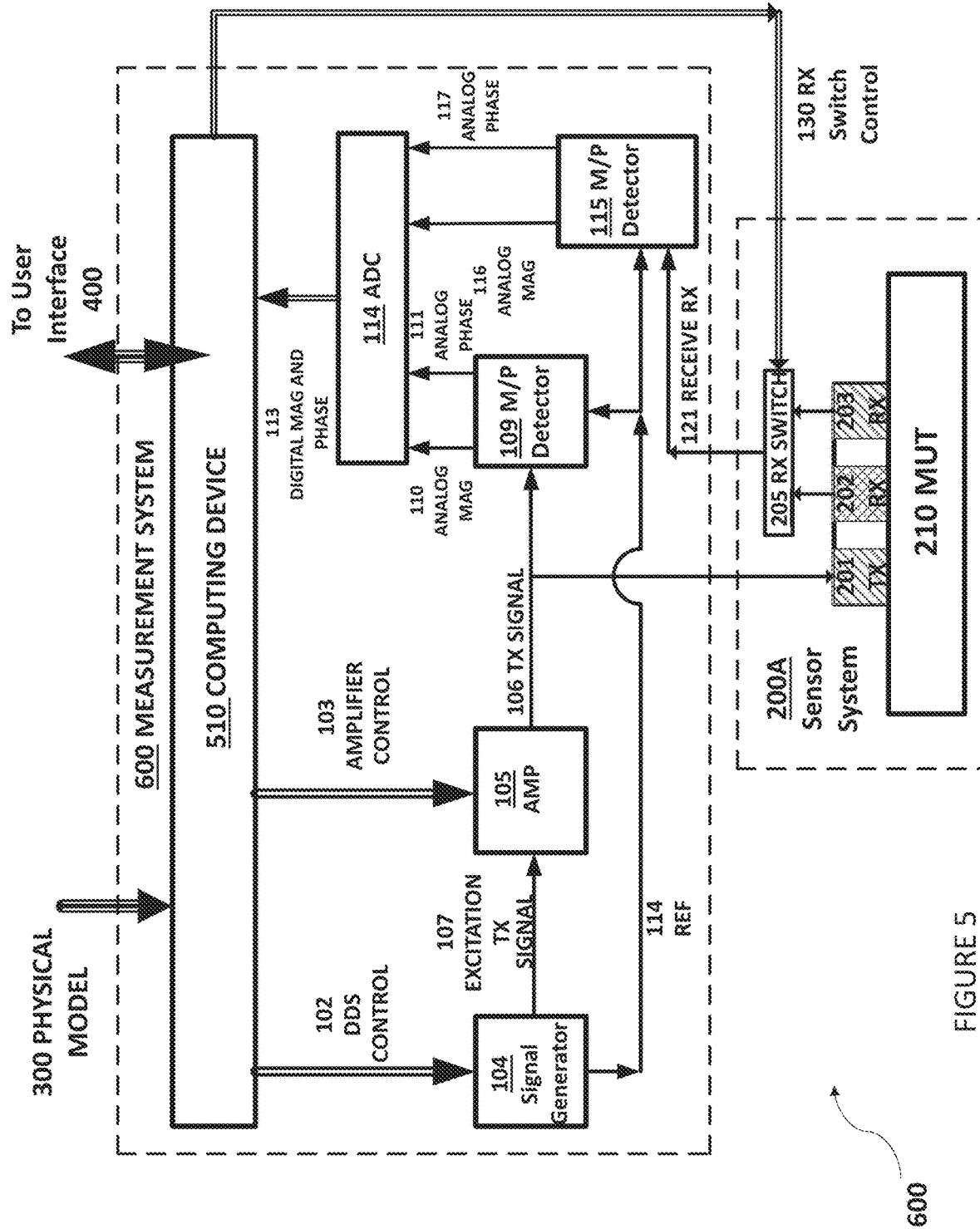

FIG. 5 shows an additional system 600 according to various implementations. System 600 can include a number of components described with respect to other systems disclosed herein, e.g., measurement systems 100 (FIG. 3) and 500 (FIG. 4). In certain implementations, system 600 includes the measurement system 500 shown and described with reference to FIG. 4. However, in contrast to the depiction in FIG. 4, system 600 includes a distinct sensor system 200A that includes an RX switch 205 in communication with computing device 510. In certain implementations, the electrodes in sensor system 200A also differ from the electrodes in sensor system 200 (FIG. 4). That is, electrodes 201, 202, 203 in sensor system 200A are arranged in a linear (or semi-circular) array of sensors. This arrangement of the sensors permits an examination of the spatial or tomographic distribution of physical properties of the MUT 210. In this example implementation, the sensor system 200A includes one excitation electrode (TX) 201 and two distinct receive (RX) electrodes 202 and 203. A similar electrode arrangement is illustrated in US Patent Publication No. 2018/0128934 and U.S. Pat. Nos. 9,465,061 and 9,804,112 (all incorporated by reference herein). In various implementations, the excitation electrode (TX) 201 is always active while one active receive electrode (selected from the receive (RX) electrodes 202 or 203), is selected via a control signal 130 from the computing device 510 and the RX switch 205. The volumes of the MUT that are measured differ between the measurement with transmitting electrode (TX) 201 and receiving electrode (RX) 202 versus measurement with transmitting electrode (TX) 201 and receiving electrode (RX) 203. Applying the teachings of U.S. Pat. Nos. 9,465,061 and 9,804,112, the impedance spectrum of different volumes of the MUT 210 may be determined and correlated to physical properties of those volumes In various implementations, the computing devices (e.g., computing device 10, FIG. 3, or computing device 510, FIGS. 4 and 5) can be configured to adjust the TX signal and RX signal to improve the accuracy of detecting one or more physical characteristics of the MUT 210. In particular cases, the computing devices disclosed herein are configured to match the input excitation signal (e.g., excitation (TX) signal 13 or excitation (TX) signal 106) and receive signal (e.g., receive (RX) signal 16 or receive (RX) signal 121) to the design range of the M/P detectors (e.g., M/P detectors 15, 17 in FIG. 3 and M/P detectors 109, 115 in FIGS. 4 and 5), as well as adjust the reference signals (e.g., reference (REF) signal 14 in FIG. 3 and (REF) signal 114 in FIGS. 4 and 5) to obtain precise and accurate data from the MUT 210 by keeping the (TX) signal 106, the (RX) signal, and the (REF) signal 114 all within the input specifications for the (TX) M/P detector 109 and the (RX) M/P detector 115.

Figure 6:
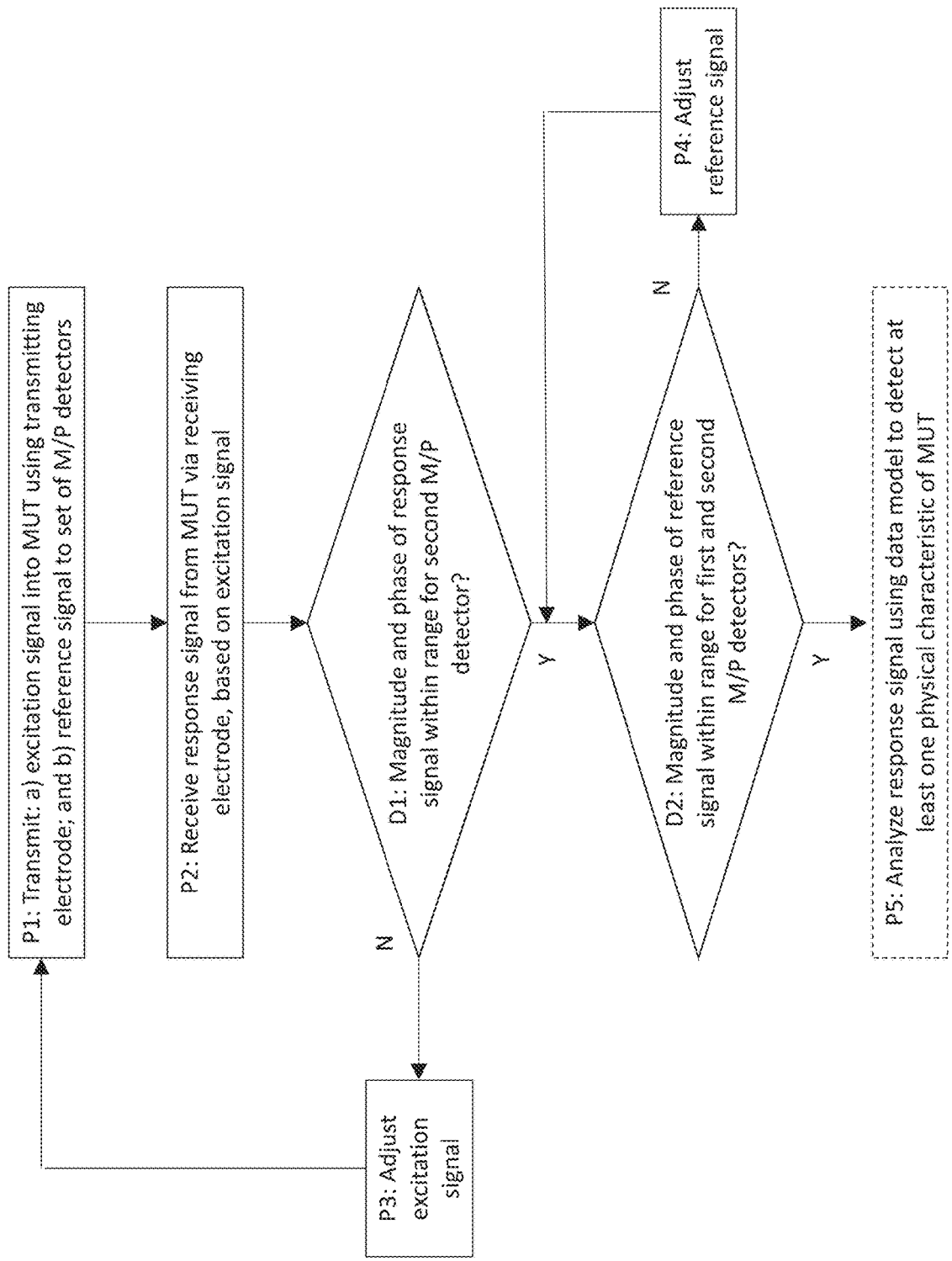
FIG. 6 is a flow diagram illustrating processes according to various implementations.

FIG. 6 is a flow diagram illustrating processes in a method according to various implementations. In some cases, the method includes characterizing an excitation signal, for example, to detect physical characteristics of an MUT. In particular cases, the method also includes detecting (or characterizing) at least one physical characteristic of the MUT using the excitation signal(s). As will be evident, processes described with reference to FIG. 6 can be applied to any of the systems disclosed herein, e.g., measurement system 100, measurement system 500 and/or measurement system 600. Turning to FIG. 6, processes can include:

Process P1: transmitting an excitation signal (e.g., excitation signal 13 or excitation signal 107) into the MUT 210 using a transmitting electrode (e.g., TX 201) on a sensor array (e.g., sensor system 200, 200A) and transmitting a reference signal (e.g., REF 14 or REF 114) to a set of magnitude and phase (M/P) detectors (e.g., M/P detectors 15, 17 or M/P detectors 109, 115). In certain cases, as noted herein, the excitation signal (e.g., excitation signal 13 or excitation signal 107) and the reference signal (e.g., REF 14 or REF 114) are both generated by a signal generator (e.g., signal generator 12 or signal generator 104) with a common control signal (e.g., control 11, control 102), where the excitation signal and the reference signal have a common frequency and a distinct magnitude and/or phase.

Process P2: receiving a response signal (e.g., receive signal 16 or receive signal 121) from the MUT 210 via a receiving electrode (e.g., RX 202 or RX 203) on the sensor array (e.g., sensor system 200, 200A) based on the excitation signal (e.g., excitation signal 13 or excitation signal 107).

Decision D1: separately comparing a magnitude and phase for the response signal (e.g., response signal 16 or response signal 121) and the reference signal (e.g., REF 14 or REF 114) with corresponding detection ranges for a second one of the M/P detectors (e.g., M/P detector 17 or M/P detector 115). As described herein, the second M/P detector (e.g., M/P detector 17 or M/P detector 115) provides a reading (e.g., to computing device 10 or 510) of the magnitude and phase of the reference signal (e.g., REF 14 or REF 114) and the response signal (e.g., response signal 16 or response signal 121). The reading for each of the reference signal (e.g., REF 14 or REF 114) and the response signal (e.g., response signal 16 or response signal 121) includes separate magnitude and phase components (e.g., FIGS. 4 and 5).

If No to Decision D1, process P3 includes adjusting the excitation signal (e.g., excitation signal 13 or excitation signal 107), e.g., by increasing or decreasing the amplitude or magnitude of that signal, e.g., via a control signal 102 to the signal generator (e.g., signal generator 13 or signal generator 104). In certain implementations, as illustrated in the embodiments in FIGS. 3 and 4, the computing device (e.g., computing device 10 or computing device 510) adjusts the amplification of the excitation signal (e.g., excitation signal 107), e.g., generating TX signal 106.

If Yes to Decision D1, Decision D2 includes separately comparing a magnitude and phase for the reference signal (e.g., REF 14 or REF 114) with corresponding detection ranges for each of a first one of the M/P detectors (e.g., M/P detector 15 or M/P detector 109) and a second one of the M/P detectors (e.g., M/P detector 17 or M/P detector 115). As described herein, the first M/P detector (e.g., M/P detector 15 or M/P detector 109) provides a reading (e.g., to computing device 10 or 510) of the magnitude and phase of the excitation signal and the reference signal, and the second M/P detector (e.g., M/P detector 17 or M/P detector 115) provides a reading (e.g., to computing device 10 or 510) of the reference signal and the response signal. In some cases, the reading for each of the received excitation signal, the reference signal and the response signal includes separate magnitude and phase components (e.g., FIGS. 4 and 5).

If No to Decision D2 (meaning that reference signal deviates from range of both the first and second M/P detectors), proceed to process P4, which includes adjusting the magnitude and/or phase of the reference signal (e.g., REF 14 or REF 114). As with the decision loop D1, negative responses to decision loop D2 can trigger iterative adjustment of the reference signal until both the response signal requirements (Decision D1) and the reference signal requirements (Decision D2) are satisfied.

A Yes response to Decision D2 means that the response signal (e.g., receive signal 16 or receive signal 121) and the reference signal (e.g., REF 14 or REF 114) have both a magnitude and a phase within the corresponding detection ranges for the second M/P detector (e.g., M/P detector 17 or M/P detector 115), and the reference signal (e.g., REF 14 or REF 114) has a magnitude and phase with the corresponding detection ranges for both the first and second M/P detectors (e.g., M/P detectors 15 and 17 or M/P detectors 109 and 115). In this case, process P5 can include analyzing the response signal data from the second M/P detector (e.g., M/P detector 17 or M/P detector 115) and the reference signal (REF 14 or REF 114) using a data model (e.g., physical model 300) about physical characteristics of the MUT 210 to detect at least one physical characteristic of the MUT 210. In particular cases, this analysis includes correlating impedance or dielectric values in the response signal (e.g., receive signal 16 or receive signal 121) with a response signal-to-physical characteristic correspondence table (e.g., in physical model 300).

One or more of the above-noted processes can be modified according to the various implementations described herein. For example, signals such as the reference signal, the excitation signal and the response signal can be converted from analog format to digital format prior to separately comparing those signals with the corresponding detection ranges for the first and second M/P detectors 109, 115, e.g., as illustrated in FIGS. 4 and 5. Even further, in cases where the sensor system (e.g., sensor system 200A) includes a plurality of distinct receiving electrodes (e.g., RX 202, RX 203), approaches can include switching between receiving electrodes (e.g., RX 202 or RX 203) for the response signal using an electrode switch (e.g., RX switch 205, FIG. 5).

FIG. 7 is a flow diagram illustrating processes in an additional method of detecting a physical characteristic of an MUT 210 using one or more systems herein. In various implementations, the method is performed by execution of program code or other programmable instructions at a processor such as the processor(s) in the computing device 10 of FIG. 3 or the computing device 510 of FIGS. 4 and 5.

In particular implementations process P101 includes obtaining a physical model of the MUT 300, e.g., as a data file or set of data files, via one or more communications media. The physical model of the MUT 300 includes the frequency range over which impedance and/or dielectric data must be secured from the MUT 210 in order to correlate that impedance and/or dielectric data with one or more physical properties of the MUT 210. The model 300 can also include information about the amplitudes of the excitation signal and reference signal for collecting data about the MUT 210.

In process P102, the computing device (e.g., computing device 10 or computing device 510) transmits a control signal (e.g., control signal 11 in FIG. 1 or control signal 102 in FIGS. 4 and 5) to a signal generator (e.g., signal generator 12 or 104) to initiate generation of excitation and reference signals (e.g., signals 13 and 14, or signals 107 and 114) at a frequency and amplitude (or over a range of frequencies and amplitudes) within a predefined range(s) of amplitudes and phase for the M/P detectors (e.g., M/P detectors 15, 17 or M/P detectors 109, 115). In certain implementations, information about the desired frequency range and the possible range of measured magnitudes and phases of the impedance spectrum is obtained from prior field testing or laboratory testing with a system as described in U.S. Provisional Patent Application No. 62/661,682, previously incorporated by reference herein. In the case of measurement system 500 (FIGS. 4 and 5), the computing device can also be configured to send an amplifier control signal 103 to the amplifier 105 for amplifying the excitation signal 107.

Also in P102, in response to the control signals from the computing device, the signal generator (e.g., signal generator 12 or 104) generates an excitation signal 13 (FIG. 3) or 107 (FIGS. 4 and 5), and in particular cases, the amplifier 105 (FIGS. 4 and 5) amplifies the excitation signal, according to the commanded frequency, amplitude and phase dictated by the control signals. The TX signal (e.g., TX signal 13, FIG. 3, or TX signal 106, FIGS. 4 and 5) is applied to the excitation electrode 201 in the sensor system 200 (FIGS. 3 and 4) or 200A (FIG. 5). The current produced by the excitation signal passes through the MUT 210 and is detected at the receiving electrode 202 (FIGS. 3 and 4) or multiple receiving electrodes 202, 203 (FIG. 5). The detected current at receiving electrode(s) is converted to the (received) voltage signal (e.g., RX signal 16 in FIG. 3 or RX signal 121 in FIGS. 4 and 5), which is measured in M/P detector(s) (e.g., M/P detector 17 in FIG. 3 or M/P detector 115 in FIGS. 4 and 5). The M/P detector produces magnitude and phase data about the RX signal. In the illustrations in FIGS. 4 and 5, the magnitude and phase detector is configured to produce analog output voltages. In these cases, the voltages, which are proportional to the measured magnitude and phase, are converted to digital signals in the analog to digital converter 114 and transmitted to the computing device 510 101. In FIG. 3, the M/P detector 17 transmits the signals to the computing device 10.

In P103, the amplitude of the receive signal (e.g., receive signal 16 in FIG. 3 or receive signal 121 in FIGS. 4 and 5) is compared to the specified amplitude input range of the M/P detector (e.g., M/P detector 17 in FIG. 3 or M/P detector 115 in FIGS. 4 and 5). If the measured magnitude, which quantifies the amplitude of the receive signal (e.g., receive signal 16 in FIG. 3 or receive signal 121 in FIGS. 4 and 5) relative to the commanded amplitude of the reference signal (e.g., REF signal 14 in FIG. 3 or REF signal 114 in FIGS. 4 and 5), indicates that the amplitude of the receive signal is not within the specified range, P101 and P102 are repeated with a different amplitude of the excitation signal (106). In P104, the excitation amplitude is adjusted to bring the amplitude of the receive signal (e.g., receive signal 16 in FIG. 3 or receive signal 121 in FIGS. 4 and 5) within the specified input range of the M/P detector (e.g., M/P detector 17 in FIG. 3 or M/P detector 115 in FIGS. 4 and 5), for example, to produce a desired quality of the magnitude output signal. In some cases, this includes keeping the measured magnitude of the (TX) signal 106, the (RX) signal, and the (REF) signal 114 all within the input specifications for the (TX) M/P 109 and (RX) M/P 115. Otherwise, the procedure moves to process P105 if the measured phase of the (TX) signal 106 or the (RX) signal are outside of the specified phase range limitations for the M/P detector 115, or to process P107 if phase adjustments are not necessary.

In P107, the computing device (e.g., computing device 10 or computing device 510) adjusts the phase of the signal generated by the signal generator (e.g., signal generator 12 or 104) to match the phase of the signal required for the specified range of the M/P detector (e.g., M/P detector 17, FIG. 3 or M/P detector 115, FIGS. 4 and 5). The data from the last reading from process P105 provides the initial value of phase for process P106.

In P106, the measured receive signal (e.g., RX signal 16, FIG. 3, or RX signal 121, FIGS. 4 and 5) is compared to the specified input phase range for the magnitude and phase detector (e.g., M/P detector 17, FIG. 3 or M/P detector 115, FIGS. 4 and 5). If the measured phase is not with in the specified input range of the RX M/P 115 or the TX M/P 109, P106 is repeated with a different phase of the excitation signal (e.g., TX signal 13, FIG. 3 or TX signal 106, FIGS. 4 and 5) with the magnitude of the excitation signal fixed. In P108, the phase is adjusted to bring the phase of the receive signal (e.g., RX signal 16, FIG. 3, or RX signal 121, FIGS. 4 and 5) within the specified input range of the phase detector (e.g., M/P detector 17, FIG. 3 or M/P detector 115, FIGS. 4 and 5). Otherwise, the process moves to Process P109.

At this point, the frequency, amplitude and phase of the excitation signal (e.g., TX signal 13, FIG. 3 or TX signal 106, FIGS. 4 and 5) and receive signal (e.g., RX signal 16, FIG. 3, or RX signal 121, FIGS. 4 and 5) are fixed. In P109, the reference signal (e.g., REF 14, FIG. 3 or REF 114, FIGS. 4 and 5) is adjusted for the receive (RX) magnitude and phase measurement. The amplitude and phase of this signal is selected to be within the respective specified input ranges of the magnitude and phase detector 115 (e.g. the specifications of the Analog Devices AD8302) such that the amplitude of the reference signal is as close as possible to the amplitude of the receive (RX) signal and the phase difference is 90°, where the phase difference can be detected with highest precision.

In P110, the measured magnitude and phase of the receive signal (e.g., RX signal 16, FIG. 3, or RX signal 121, FIGS. 4 and 5) are compared to target output magnitude and phase of the level and phase detector (e.g., M/P detector 17, FIG. 3 or M/P detector 115, FIGS. 4 and 5). If the measured magnitude and phase from detector (e.g., M/P detector 17, FIG. 3 or M/P detector 115, FIGS. 4 and 5) is not within specified tolerance bands based on the signal to noise ratios around the target magnitude and phase, P109 is repeated with a magnitude and phase of the reference signal (e.g., REF 14, FIG. 3 or REF 114, FIGS. 4 and 5) that is increased or decreased to match the target values. Otherwise, the procedure is continued in P110.

In P110, the reference signal (e.g., REF 14, FIG. 3 or REF 114, FIGS. 4 and 5) is adjusted for the excitation (TX) magnitude and phase measurement. The amplitude and phase of this signal is selected to be within the respective specified input ranges of the magnitude and phase detector (e.g., M/P detector 15, FIG. 3 or M/P detector 109, FIGS. 4 and 5) such that the amplitude of the reference signal is approximately equal to the amplitude of the TX signal and the phase difference is 90°, where the phase difference can be detected with sufficient precision.

In P112, the measured magnitude and phase of the excitation signal (e.g., TX signal 13, FIG. 3 or TX signal 106, FIGS. 4 and 5) are compared to target output magnitude and phase of the level and phase detector (e.g., M/P detector 15, FIG. 3 or M/P detector 109, FIGS. 4 and 5). If the measured magnitude and phase from detector 109 is not within specified tolerance bands based on the signal to noise ratios around the target magnitude and phase, P111 is repeated with different amplitude and phase of the reference signal (114). Otherwise, the procedure is repeated with a different frequency within the specified range of frequencies starting in Process P102 or completed in Process P112.

The computation of the magnitude and phase of the excitation signal 106 relative to the receive signal 121 is described herein. These values are used to compute the measured impedance or dielectric properties over the range of frequencies to correlate with the physical properties of interest for the MUT.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit). Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

In various embodiments, components described as being "coupled" to one another can be joined along one or more interfaces. In some embodiments, these interfaces can include junctions between distinct components, and in other cases, these interfaces can include a solidly and/or integrally formed interconnection. That is, in some cases, components that are "coupled" to one another can be simultaneously formed to define a single continuous member. However, in other embodiments, these coupled components can be formed as separate members and be subsequently joined through known processes (e.g., fastening, ultrasonic welding, bonding).

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method of characterizing a response signal for detecting physical characteristics of a material under test (MUT), the method comprising:
   transmitting an excitation signal into the MUT and transmitting a reference signal to a set of magnitude and phase (M/P) detectors;
   receiving the response signal from the MUT based on the excitation signal;
   separately comparing a magnitude and phase for each of the excitation signal and the reference signal with corresponding detection ranges for a first one of the M/P detectors;
   separately comparing a magnitude and phase for each of the response signal and the reference signal with corresponding detection ranges for a second one of the M/P detectors;
   iteratively adjusting the excitation signal until the response signal has both a magnitude and phase within the corresponding detection ranges for the second M/P detector; and
   iteratively adjusting the reference signal until the reference signal has both a magnitude and a phase within the corresponding detection ranges for both the first and second M/P detectors.

2. The method of claim 1, wherein the excitation signal and the reference signal are both generated by a signal generator with a common control signal, and wherein the excitation signal and the reference signal have a common frequency and a distinct magnitude and/or phase.

3. The method of claim 1, further comprising attenuating the excitation signal prior to the separately comparing the excitation signal and the reference signal with the corresponding detection ranges for the first one of the M/P detectors and the separate comparing of the response signal and the reference signal with the corresponding detection ranges for the second one of the M/P detectors.

4. The method of claim 1, wherein the first M/P detector provides a reading of the magnitude and phase of the excitation signal and the reference signal, and wherein the second M/P detector provides a reading of the magnitude and phase of the reference signal and the response signal.

5. The method of claim 4, wherein:
   the readings are obtained by a computing device configured to control the iterative adjustment of the excitation signal and the reference signal, and/or
   the reading for each of the excitation signal, the reference signal and the response signal comprises separate magnitude and phase components.

6. The method of claim 1, further comprising down-converting a portion of the excitation signal to a predetermined frequency.

7. The method 6, wherein the reference signal remains at a fixed frequency while the portion of the excitation signal is down-converted, wherein the predetermined frequency of the down-converted portion of the excitation signal includes a range of approximately 10 kHz to approximately 1 MHz.

8. The method of claim 7, wherein the reference signal is maintained at a fixed frequency to match a frequency of a mixer output.

9. A system configured to characterize a response signal for detecting physical characteristics of a material under test (MUT), the system comprising:
   a sensor array for communicating with the MUT;
   a set of magnitude and phase (M/P) detectors;
   a signal generator coupled with the set of M/P detectors and the sensor array; and a computing device configured to control processes including:
 initiating: a) transmission of an excitation signal into the MUT with a transmitting electrode on the sensor array and b) transmission of a reference signal to the set of magnitude and phase (M/P) detectors;
 receiving a response signal from the MUT via a receiving electrode on the sensor array based on the excitation signal;
 separately comparing a magnitude and phase for each of the excitation signal and the reference signal with corresponding detection ranges for a first one of the M/P detectors;
 separately comparing a magnitude and phase for each of the response signal and the reference signal with corresponding detection ranges for a second one of the M/P detectors;
 iteratively adjusting the excitation signal until the response signal has both a magnitude and a phase within the corresponding detection ranges for the second M/P detector; and
 iteratively adjusting the reference signal until the reference signal has both a magnitude and a phase within the corresponding detection ranges for the first and the second M/P detectors.

10. The system of claim 9, wherein the computing device is further configured to:
 compute an electromagnetic property of the MUT based on the measured magnitude and phase for the response signal and the reference signal; and
 correlate the electromagnetic property with a physical property of the MUT based on a physical model of the MUT or a laboratory test of the MUT.

11. The system of claim 9, wherein the excitation signal and the reference signal are both generated by the signal generator with a common control signal, and wherein the excitation signal and the reference signal have a common frequency and a distinct magnitude and/or phase.

12. The system of claim 9, wherein the signal generator includes multi-channel signal generation with three or more channels.

13. The system of claim 9, wherein the computing device is further configured to attenuate the excitation signal prior to the separate comparing of the excitation signal and the reference signal with the corresponding detection ranges for the first one of the M/P detectors and the separate comparing of the response signal and the reference signal with the corresponding detection ranges for the second one of the M/P detectors.

14. The system of claim 9, wherein the first M/P detector provide a reading of the magnitude and phase of the excitation signal and the reference signal, and wherein the second M/P detector provides a reading of the magnitude and phase of the reference signal and the response signal.

15. The system of claim 14, wherein:
 the readings are obtained by the computing device configured to control the iterative adjustment of the excitation signal and the reference signal, and/or
 the reading for each of the excitation signal, the reference signal and the response signal comprises separate magnitude and phase components.

16. An electronic circuit configured to:
 generate an excitation signal and a reference signal at a specific frequency or over a range of frequencies;
 apply the excitation signal to a material under test (MUT);
 receive a response signal from the MUT;
 determine a magnitude and phase relationship between the response signal produced in presence of the MUT relative to the reference signal;
 compute impedance and dielectric properties of the MUT based on the magnitude and phase relationship between the response signal and the reference signal; and
 apply the computed dielectric properties to a physical model to correlate the measurement to at least one physical property of the MUT.

17. The electronic circuit of claim 16, wherein an amplitude of the excitation signal and an amplitude of the reference signal are independently set to control determination of the magnitude and phase relationship between the response signal and the reference signal.

18. The electronic circuit of claim 16, wherein computing the impedance and dielectric properties of the MUT is performed using a computational model of the physical characteristics of the MUT and a sensing system.

19. The electronic circuit of claim 16, further configured to:
 send a first portion of the excitation signal to a magnitude and phase (M/P) detector and send a second portion of the excitation signal to a transmitting electrode for application to the MUT; and
 attenuate the first portion of the excitation signal to produce an intermediate signal.

20. The electronic circuit of claim 19, wherein a frequency of the excitation signal varies across a range of frequencies, and wherein a frequency of the intermediate signal varies with the excitation signal at a lesser amplitude.

\* \* \* \* \*